(12) United States Patent
Tran et al.

(10) Patent No.: US 7,257,043 B2
(45) Date of Patent: Aug. 14, 2007

(54) ISOLATION DEVICE OVER FIELD IN A MEMORY DEVICE

(75) Inventors: Luan C. Tran, Meridian, ID (US); Stephen R. Porter, Boise, ID (US); Scot M. Graham, Boise, ID (US); Steven E. Howell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/358,234

(22) Filed: Feb. 21, 2006

(65) Prior Publication Data

US 2006/0139988 A1    Jun. 29, 2006

Related U.S. Application Data

(63) Continuation of application No. 10/998,483, filed on Nov. 29, 2004, now Pat. No. 7,020,039, which is a continuation of application No. 10/233,325, filed on Aug. 29, 2002, now Pat. No. 6,834,019.

(51) Int. Cl.
*G11C 7/00* (2006.01)

(52) U.S. Cl. .................. 365/222; 365/149; 365/63; 257/906

(58) Field of Classification Search ................ 365/222, 365/149, 63, 51; 257/906, 905, 71, 69
See application file for complete search history.

(56) References Cited

U.S. PATENT DOCUMENTS

| 6,177,333 | B1 | 1/2001 | Rhodes |
| 6,212,114 | B1 | 4/2001 | Cowles |
| 6,297,129 | B2 | 10/2001 | Tran |
| 6,411,555 | B1 | 6/2002 | Tran |
| 6,445,610 | B1 | 9/2002 | Porter et al. |
| 6,535,439 | B2 * | 3/2003 | Cowles ...................... 365/201 |
| 6,545,899 | B1 | 4/2003 | Derner et al. |
| 6,545,904 | B2 | 4/2003 | Tran |
| 6,556,467 | B2 | 4/2003 | Derner et al. |
| 6,590,817 | B2 | 7/2003 | Siek |
| 6,594,173 | B2 | 7/2003 | Keeth |
| 6,607,944 | B1 | 8/2003 | Tran |
| 6,660,584 | B2 | 12/2003 | Tran |
| 6,661,699 | B1 | 12/2003 | Walker |
| 6,735,132 | B2 | 5/2004 | Siek |
| 6,744,676 | B2 * | 6/2004 | Leung et al. .......... 365/189.09 |
| 6,785,157 | B2 | 8/2004 | Arimoto et al. |
| 6,834,019 | B2 | 12/2004 | Tran et al. |
| 2001/0052612 | A1 | 12/2001 | Tran et al. |
| 2002/0140348 | A1 | 10/2002 | Takeuchi et al. |
| 2002/0195670 | A1 | 12/2002 | Tran |
| 2003/0095428 | A1 | 5/2003 | Tran |

(Continued)

*Primary Examiner*—Anh Phung
*Assistant Examiner*—Toan Le
(74) *Attorney, Agent, or Firm*—Schwegman, Lundberg, Woessner & Kluth, P.A.

(57) ABSTRACT

A memory device includes isolation devices located between-memory cells. A plurality of isolation lines connects the isolation devices to a positive voltage during normal operations but still keeps the isolation devices in the off state to provide isolation between the memory cells. A current control circuit is placed between the isolation lines and a power node for reducing a current flowing between the isolation lines and the power node in case a deflect occurs at any one of isolation devices.

36 Claims, 9 Drawing Sheets

U.S. PATENT DOCUMENTS

2003/0102515 A1 6/2003 Tran et al.
2003/0198111 A1 10/2003 Siek
2003/0203565 A1 10/2003 McQueen et al.
2004/0016986 A1 1/2004 Meyer et al.
2005/0099836 A1 5/2005 Tran et al.

* cited by examiner

ISOLATION DEVICE OVER FIELD IN A MEMORY DEVICE

This application is a Continuation of U.S. application Ser. No. 10/998,483, filed Nov. 29, 2004, now U.S. Pat. No. 7,020,039, which is a Continuation of U.S. application Ser. No. 10/233,325, filed Aug. 29, 2002, now U.S. Pat. No. 6,834,019, which are incorporated herein by reference.

FIELD

The present invention relates generally to semiconductor devices, and in particular to memory devices.

BACKGROUND

Memory devices reside in computers and many electronic products to store data. A typical memory device has many memory cells, each holding a charge that represents a value of a bit of data.

Some memory devices hold the charge in a capacitor of each memory cell. The charge in the capacitor leaks overtime. Therefore, some of these memory devices have refresh cycles to frequently refresh the charge to maintain its original value to keep the data valid.

In some memory devices, the charge in the capacitor of one memory cell leaks to the substrate or to an adjacent capacitor of another memory cell. This leakage reduces the retention time of the memory cell and may create invalid data. Isolation techniques have been designed to isolate adjacent memory cells to extend the retention time of the charge in the capacitor and to reduce the number of refresh cycles:

In some cases, these isolation techniques provide inadequate isolation. Thus, the number of the refresh cycles is increased. Increasing the number of refresh cycles wastes power and reduces the time that the valid data is available.

Further, some memory devices use a double-row redundancy method, in which two redundant rows of memory cells are used when a defect occurs in one of the rows; one redundant row replaces the row with the defect and the other redundant row replaces the adjacent row although the adjacent row has no defect. This double-row redundancy method is used because the isolation devices in these memory devices may not provide enough insolation between adjacent rows.

SUMMARY OF THE INVENTION

The present invention provides structures and methods for improving isolation between adjacent memory cells to reduce the charge leakage, to improve the refresh operation, increase the time availability of the data, and offer alternative ways for replacing defected memory cells.

One aspect provides a memory device with a first memory cell having a first access transistor and a first capacitor. The first access transistor connects to the first capacitor at a first storage node. A second memory cell includes a second access transistor and a second capacitor. The second access transistor connects to the second capacitor at a second storage node.

The memory device also includes an isolation device having an isolation gate, a first electrode connected to the first storage node, a second electrode connected to the second storage node. The isolation device is configured to provide electrical isolation between the first and second storage nodes.

The memory device further includes a current control circuit connected between the isolation gate and a power node for modifying a resistance between the isolation gate and the power node.

Another aspect offers a method of forming a memory device. A first memory cell is formed on a first memory cell area in a substrate. The first memory cell has a first access transistor and a first capacitor connected together at a first storage node formed on a substrate. A second memory cell is formed on a second memory cell area of the substrate. The second memory cell has a second access transistor and a second capacitor connected together at a second storage node on the substrate. The method also includes forming an isolation device on the isolation device area for electrically isolating the first and second memory cells. The isolation device has an isolation gate. The method further includes forming an isolation line for connecting the isolation gate to a positive voltage.

DESCRIPTION OF EMBODIMENTS

Figure 1:
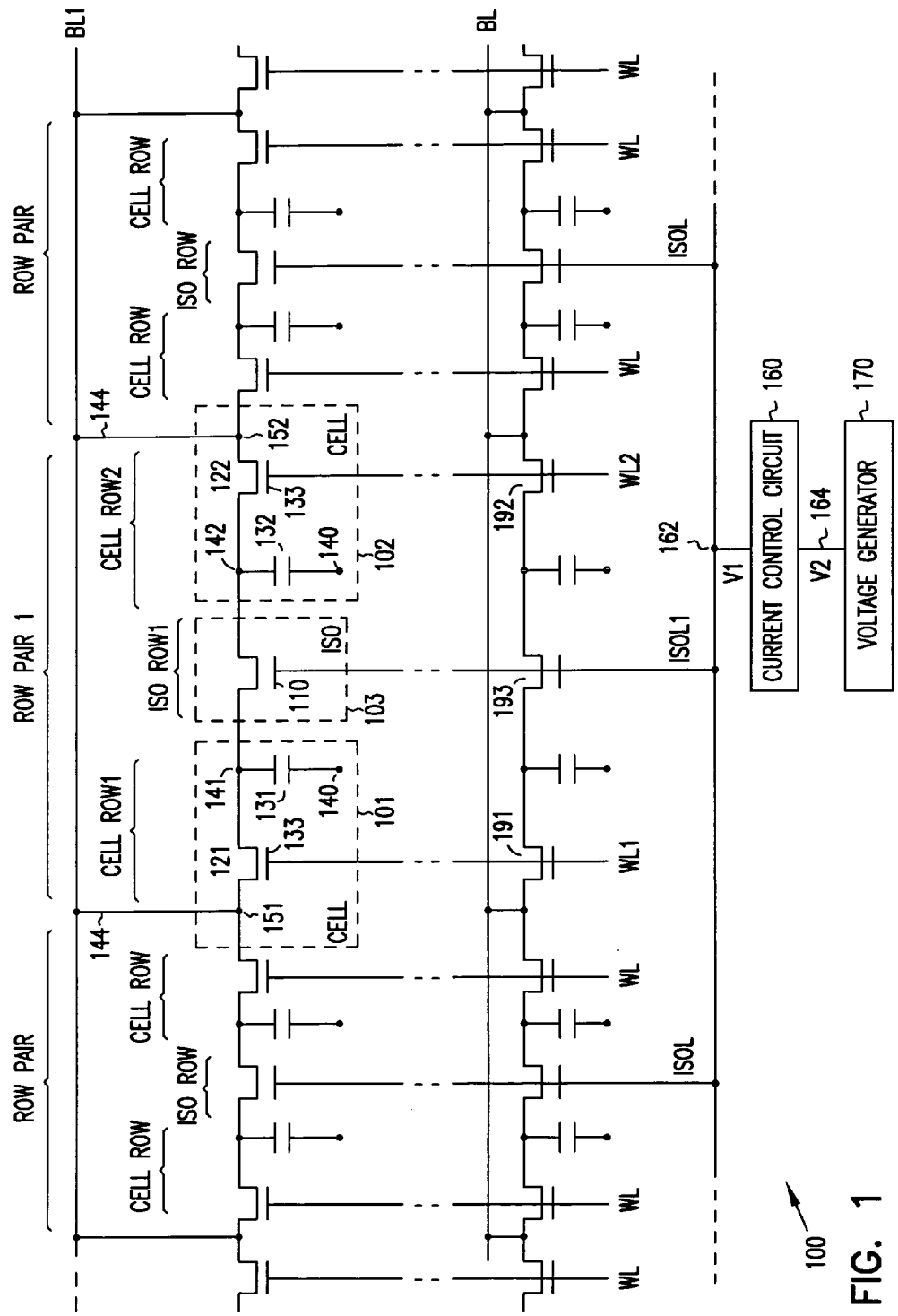
FIG. 1 is a schematic diagram of a memory array according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 is a schematic diagram of a memory array according to an embodiment of the invention. Memory array 100 includes many memory cells (CELL) arranged in rows (CELL ROW) and columns (CELL COL), the rows being arranged in row pairs (ROW PAIR) with each including a first cell row (CELL ROW 1) and a second cell row (CELL ROW2). For simplicity, FIG. 1 shows only three row pairs and two cell columns of memory array 100. Other row pairs and columns have elements similar to the elements of the row pairs and cell columns shown in FIG. 1.

Each of the memory cells includes an access transistor and a capacitor. For example, memory cell 101 of the first cell row includes an access transistor 121 connected to a capacitor 131 at a first storage node 141. Memory cell 102 of the second cell row includes an access transistor 122 connected to a capacitor 132 at a second storage node 142. Each of the storage nodes connects to one plate of the capacitor. The other plate of each of the capacitors connects to a potential node (cell plate) 140, which connects to ground or to a positive voltage to set the initial amount of charge of the capacitor.

A number of word lines (WL) extend along the cell rows. Each cell row has a corresponding word line. In a cell row, the corresponding word line connects to all of the gates of the access transistors in that cell row. For example, in CELL ROW1, word line WL1 connects to the gates of transistors 121 and 191 and in CELL ROW2, word line WL2 connects to the gates of access transistors 122 and 192.

A number of bit lines (BL) extend along the cell columns. Each cell column has a corresponding bit line. In a cell column, the corresponding line connects to all of the access transistors in that cell column at an electrode of each of the access transistors via a bit line contact 144. For example, in CELL COL1, bit line BL1 connects to electrode 151 of access transistor 121 and electrode 152 of access transistor 122. In the description, an electrode of a transistor corresponds to either the source or the drain of the transistor.

A number of isolation rows (ISO ROW) run in parallel with the cell rows. Each isolation row is located between the first and second cell rows of each row pair. For example isolation row 1 (ISO ROW1) is located between CELL ROW1 and CELL ROW2 of ROW PAIR1. Each of the isolation rows includes many isolation devices (ISO).

Each of the isolation devices has an isolation gate, and a first electrode and a second electrode connected between two adjacent storage nodes. For example, isolation device 103 of ISO ROW1 has a gate 110, a first electrode connected to storage node 141, and a second electrode connected to storage node 142.

A number of isolation lines (ISOL) extend along the isolation rows and in parallel with the word lines. Each isolation row has a corresponding isolation line. In an isolation row, the corresponding isolation line connects to all of the isolation gates of the isolation devices in that isolation row. For example, in ISO ROW1, isolation line ISOL1 connects to isolation gates of isolation devices 103 and 193.

Memory array 100 further includes a current control circuit 160 connected between a group node 162 and a power node 164. Node 162 connects all of the isolation lines together. A voltage generator 170 connects to node 164 for providing a voltage. In some embodiments, voltage generator 170 generates either a negative voltage or a positive voltage. Node 162 has a voltage V1 and node 164 has a voltage V2. In some embodiments, V1 equals the supply voltage (Vcc) of the memory array. In other embodiments, V1 is a positive voltage of about 2.4 volts. In some other embodiments, V1 is positive voltage ranging from about 1.4 volts to about 2.8 volts.

In alternative embodiments, V2 equals ground. In some of these alternative embodiments, voltage generator 170 can be omitted and node 164 can be connected to ground.

Each of the memory cells stores a charge at the storage node of the capacitor. The charge represents a value of a data bit. The access transistor accesses the charge during a read operation and transfers it to the corresponding bit line. A sense amplifier circuit (not shown) connected to the corresponding bit line translates the charge into the value of the data bit and outputs the data bit to other circuits for processing. A write operation writes a data bit into a memory cell in a reverse fashion from the read operation. Sense amplifier circuits and their operations in memory devices are well known.

To read the charge in memory cell 101, a voltage is applied to word line WL1 to turn on access transistor 121. When transistor 121 turns on, it transfers the charge from node 141 to bit line BL1 via the bit line contact 144 connected to transistor 121. Similarly, to read the charge in memory cell 102, a voltage is applied to word line WL2 to turn on access transistor 122. When transistor 122 turns on, it transfers the charge from node 142 to bit line BL1 via the bit line contact 144 connected to transistor 122.

Each of the isolation devices is configured to provide electrical isolation between two adjacent memory cells. To provide the isolation, each of the isolation devices is configured to be in an inactive state (off) to prevent conductivity between two adjacent storage nodes of two adjacent memory cells. To turn off the isolation devices and thus to improve the isolation function, an appropriate voltage is applied to all of the isolation gates of the isolation devices.

In one configuration, V1 is set at a positive voltage and below a threshold voltage of the isolation devices to turn off the isolation devices. For example, isolation device 103 is turned off to prevent conductivity between storage nodes 141 and 142 because the voltage at isolation gate 110 is below the threshold voltage of isolation device 103. A threshold voltage of a device (transistor) is the voltage at which the device starts to conduct (turn on). Since isolation gate 110 connects to isolation line ISOL1, the voltage on ISOL1 is set to be less than the threshold voltage of isolation device 103. Since ISOL1 connects to node 162, the voltage V1 at node 162 is set below the threshold voltage of isolation device 103.

In some embodiments, the isolation devices are made so that their threshold voltage is about at least three times greater than the supply voltage of memory array 100. For example, in some embodiments, the threshold voltage of isolation device 103 is about ten volts and the supply voltage is about two to three volts. Since the threshold voltage of the isolation devices is least three times greater than the supply voltage, the isolation devices do not turn on (still in the off state) but the access transistors turn on when a voltage equal to or slightly greater than the supply voltage is applied to the isolation gates and the gates of the access transistors. When the isolation devices are in the off state, they provide isolations between the memory cells.

Current control circuit 160 is configured to provide a resistance between nodes 162 and 164 to limit the flow of current between nodes 162 and 164 in case of a defect occurring at one of the isolation lines. In some embodiments, current control circuit 160 includes a resistor connected between node 162 and 164.

In a normal condition, the circuit path between voltage generator 170 and isolation device 110 is an open circuit path because isolation device 110 normally turns off (non-conductive). Thus, no current flows between nodes 162 and 164, and V1 equals V2. In some embodiments, voltage generator 170 generates a positive voltage V2. Thus, in these embodiments, V1 is also positive and equals V2.

In some cases, a defect in memory array 100 may short one of the isolation lines to another element. For example, a defect may short isolation line ISOL1 to an element connected to ground. In this case, the open circuit path between generator 170 and isolation line ISOL1 becomes a closed circuit path connecting generator 170, isolation line ISOL1, and ground. Without current control circuit 160, a certain amount of current flows between voltage generator 170 and ground via the shorted isolation line ISOL1. Thus, a certain amount of power is wasted. With current control circuit 160, the resistance provided by current control circuit 160 between nodes 164 and 162 limits (reduces) the amount of the current flowing between these two nodes. Since the amount of current is reduced, the amount of wasted power is also reduced.

Figure 2:
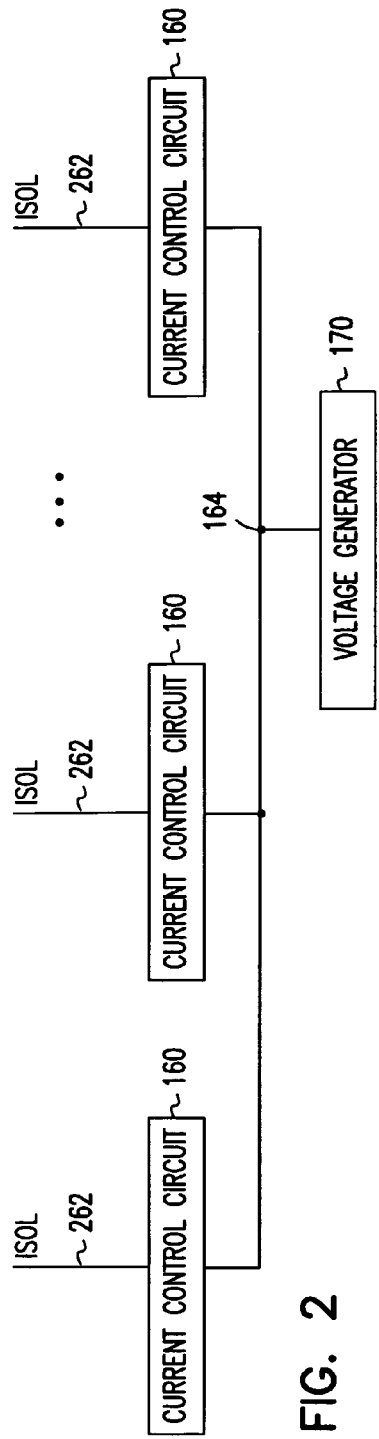
FIGS. 2–3 show various alternative embodiments of a portion of the memory array of FIG. 1.
Figure 3:
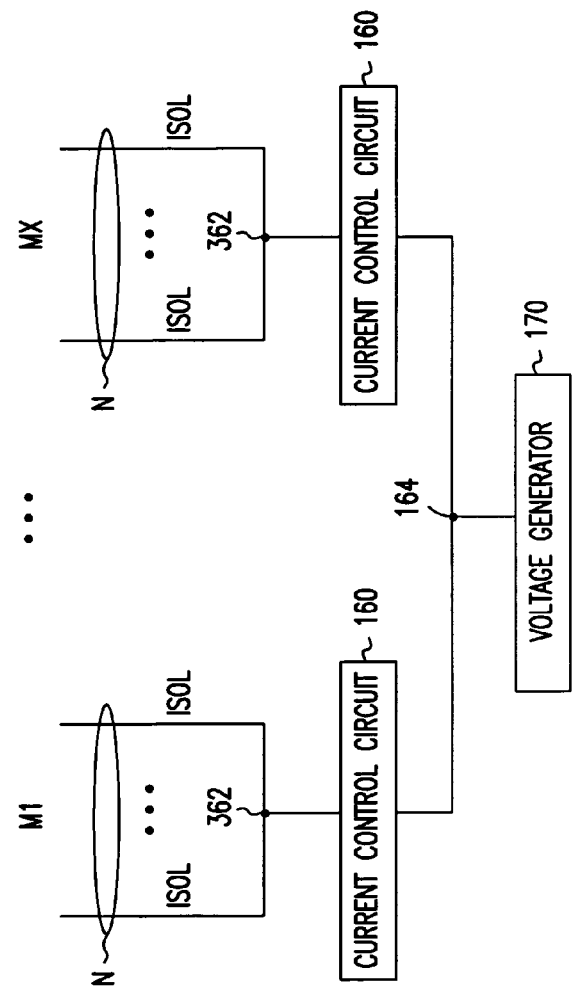

FIGS. 2 and 3 show various alternative embodiments of a portion of the memory array of FIG. 1. In FIG. 2, each of the isolation lines connects to a separate group node 262 and connects to power node 164 through a separate current control circuit 160. Node 262 corresponds to node 162 (FIG. 1). Power node 164 can be connected to a single voltage generator such as voltage generator 170 (FIG. 1) or to a number of separate voltage generators.

In FIG. 3, the isolation lines are divided into M groups (M1 through MX) with each group having N isolation lines. Each of the M groups has a group node 362 connecting together all the N isolation lines within the group. Node 362 corresponds to node 162 (FIG. 1). M is at least one and N is at least one. Each of the M groups connects to node 164 via a separate current control circuit 160. Power node 164 can be connected to a single voltage generator such as voltage generator 170 (FIG. 1) or to a number of separate voltage generators.

Figure 4:
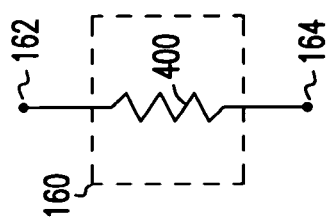

FIGS. 4–7 show examples of the current control circuit of FIGS. 1–3. Node 162 in FIGS. 4–7 corresponds to node 162, 262, and 362 (FIGS. 1–3). In FIG. 4, current control circuit 160 includes a resistor 400 connected between node 162 and 164. The resistance between nodes 162 and 164 can be selected by choosing the resistance value of resistor 400.

Figure 5:
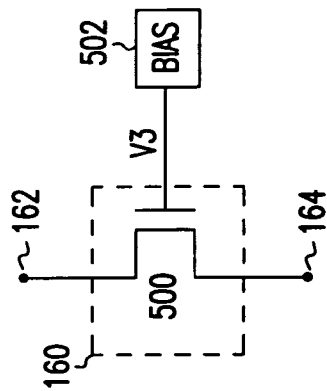

FIG. 5 shows current control circuit 160 including a transistor 500 having a first electrode (source or drain) connected to node 162, a second electrode connected to node 164, and a gate connected to a bias node. A bias unit 502 generates a voltage V3 to turn on transistor 500. The resistance between nodes 162 and 164 is chosen by selecting the appropriate size of the transistor 500, and V3. The size of transistor 500 is selected by choosing its channel length and channel width. In some embodiments, the channel length of transistor 500 is about ten times greater than a channel length of a typical transistor. For example, the channel length of transistor 500 is about one micrometer while the channel length of a typical transistor is about 100 nanometers.

Figure 6:
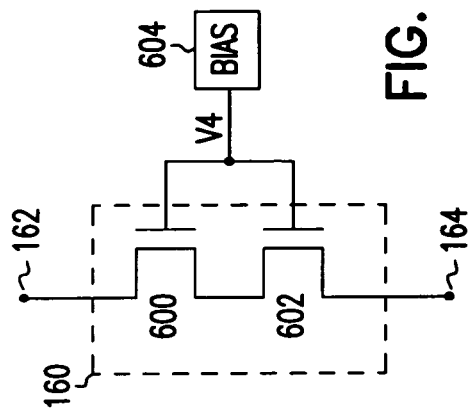
FIGS. 4–7 show examples a current control circuit of FIGS. 1–3.

FIG. 6 shows current control circuit 160 including multiple transistors 600 and 602 connected in series between nodes 162 and 164. A bias unit 604 generates a voltage V4 to control the gates of transistors 600 and 602. In some embodiments, the gates of transistors 600 and 602 connect to separate bias units to receive separate voltages. The resistance between nodes 162 and 164 is chosen by selecting appropriate size of each of the transistors 600 and 602, and V4. In some embodiments, the channel length of each of the channel length of transistors 600 and 602 can be longer than a channel length of a typical transistor.

Figure 7:
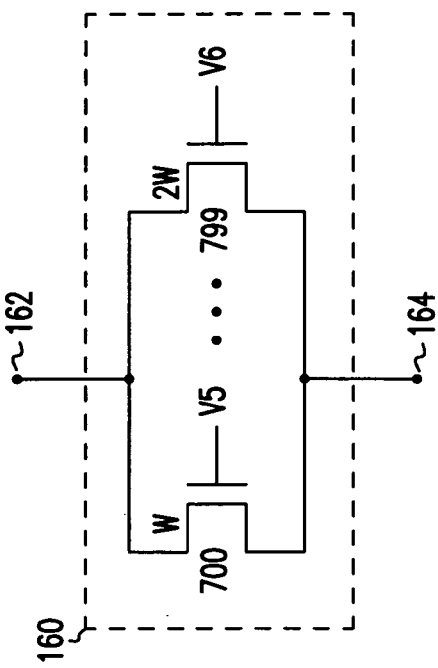

FIG. 7 shows current control circuit 160 including N transistors 700 and 799 connected in parallel between nodes 162 and 164. N can be any integer equal to or greater than two. For simplicity, FIG. 7 shows two transistors, thus N equals two. The channel width (W) of one of the transistors 700 and 799 is a multiple of two larger than the channel width of another transistor. For example, transistor 700 has a channel width of W and transistor 799 has a channel width of $2^{(N-1)}W = 2W$. In embodiments where N equals four, the channel widths of the transistors are 1W, 2W, 4W, and 8W. This kind of pattern is a binary weighted pattern. Thus, transistors 700 and 799 are binary weighted transistors.

Since each of the binary weighted transistors 700 and 799 has unequal channel width, each of these transistors provides unequal resistance between its electrodes connected between nodes 162 and 164. The total resistance between nodes 162 and 164 can be chosen by controlling voltages V5 and V6 at the gates of the transistors. For example, when both V5 and V6 are selected to be sufficient to turn on both transistors 700 and 799, the resistance between nodes 162 and 164 equals the parallel resistances of both transistors 700 and 709. As another example, when only one of the V5 or V6 is selected to turn on only one of the transistors 700 and 709, the resistance between nodes 162 and 164 equals the resistance of the transistor that turns on. Besides the embodiments shown in FIGS. 4–7, other circuits that create a resistance between nodes 162 and 164 can also be used as current control circuit 160.

Figure 8:
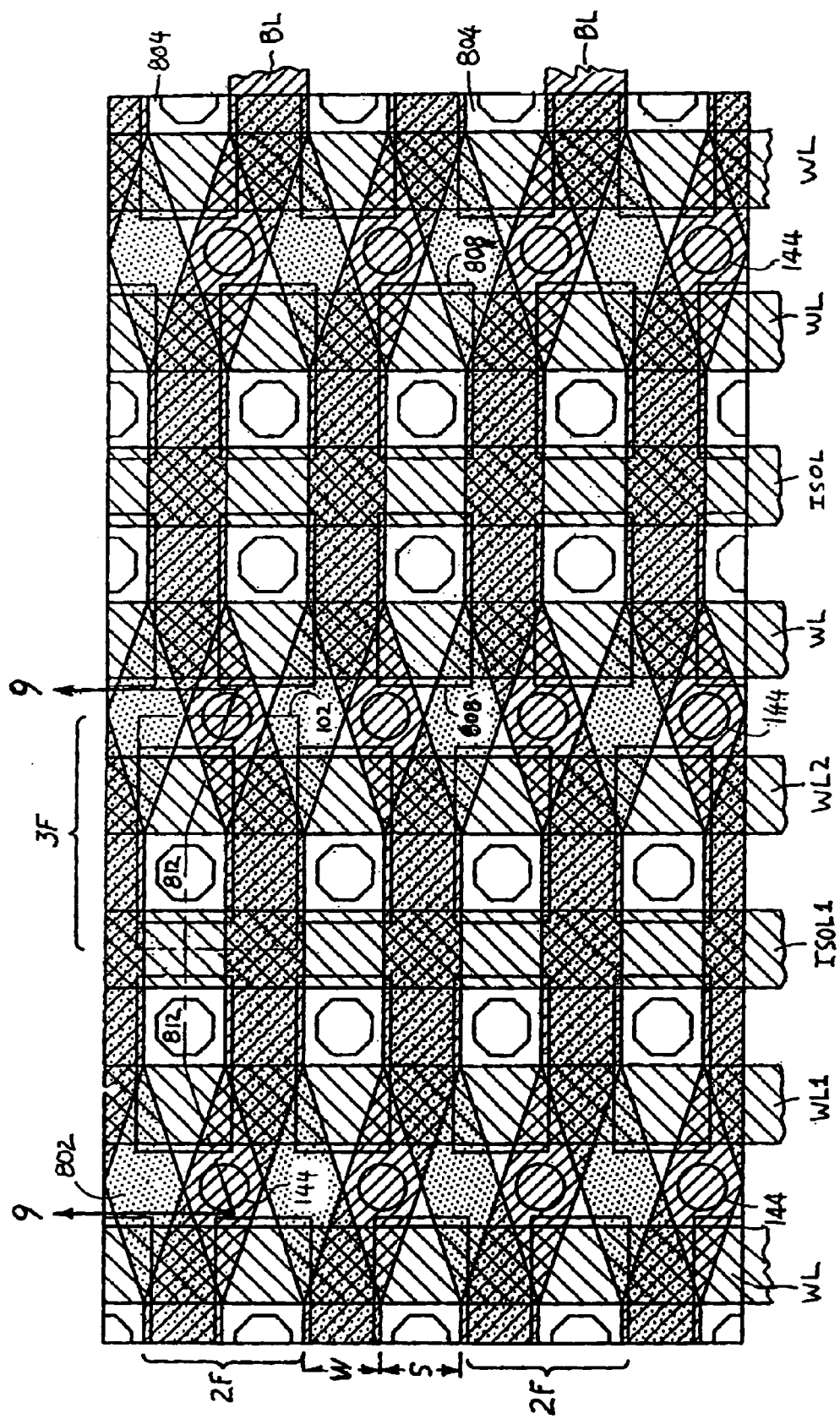
FIG. 8 is a simplified top view of a circuit layout of the memory array of FIG. 1.

FIG. 8 is a simplified top view of a circuit layout of the memory array of FIG. 1. Shallow trench isolation (STI) areas 802 are represented as stippled areas following a serpentine path across the memory array 100, with active areas 804 intervening between adjacent STI areas 802. Active areas 804 are shown as areas that are void of the stippled STI areas 802.

Bit lines BL, shown as hatched areas, also follow a serpentine path across memory array 100, but are typically formed much later in processing than the STI areas 802.

Word lines WL extend along an axis intersecting the STI areas 802 and bit lines BL, and extend across portions of the active areas 804 where word lines BL connect the gates of access transistors such as such as gates 133 (FIG. 1).

Isolation lines ISOL interspersed between selected ones of the word lines WL. Memory array 100 further includes capacitor containers 808, represented as rectangles, and bit line contacts 144, represented as circles. Container capacitors formed within the capacitor containers 808 are coupled to the active areas via storage node contacts 812. In some embodiments, the storage node contacts 812 include conductive material extending to selected portions of the active area 804 and shown schematically as octagons at one end of each of the capacitor containers 808.

A cell plate (not shown) formed of a conductive material such as doped polysilicon extends across the tops of the capacitor containers 808 and forms a common second plate of each of the capacitors, such as capacitors 131 and 132 (FIG. 1). The cell plate connects to either ground or a voltage.

Each memory cell (FIG. 1) within memory array 100 includes part of one of the bit line contacts 144 (these are shared by adjacent memory cells), a storage node contact 812, a portion of one active area 804, a portion of one isolation line ISOL, and a portion of one STI area 802, and is bounded on one side by a corresponding portion of another STI area 802. Isolation between storage node contacts 812 formed in a common portion of an active area 804 that includes one of the bit line contacts 144 results because only one of the pair of word lines WL traversing the common portion of active area 804 is activated (applied with a voltage) at any one time.

As a result, the architecture shown in FIG. 8 provides a memory cell having an area equal to about 3F×2F, or less, where "F" equals one-half of a minimum pitch "P". "P" is the smallest distance of width "W" of a line plus the width of a space immediately adjacent to the line on one side of the line between the line and a next adjacent line in a repeated pattern "S" within the array. Thus, in FIG. 2 the consumed area of a given memory cell is no greater than about 6F².

Figure 9:
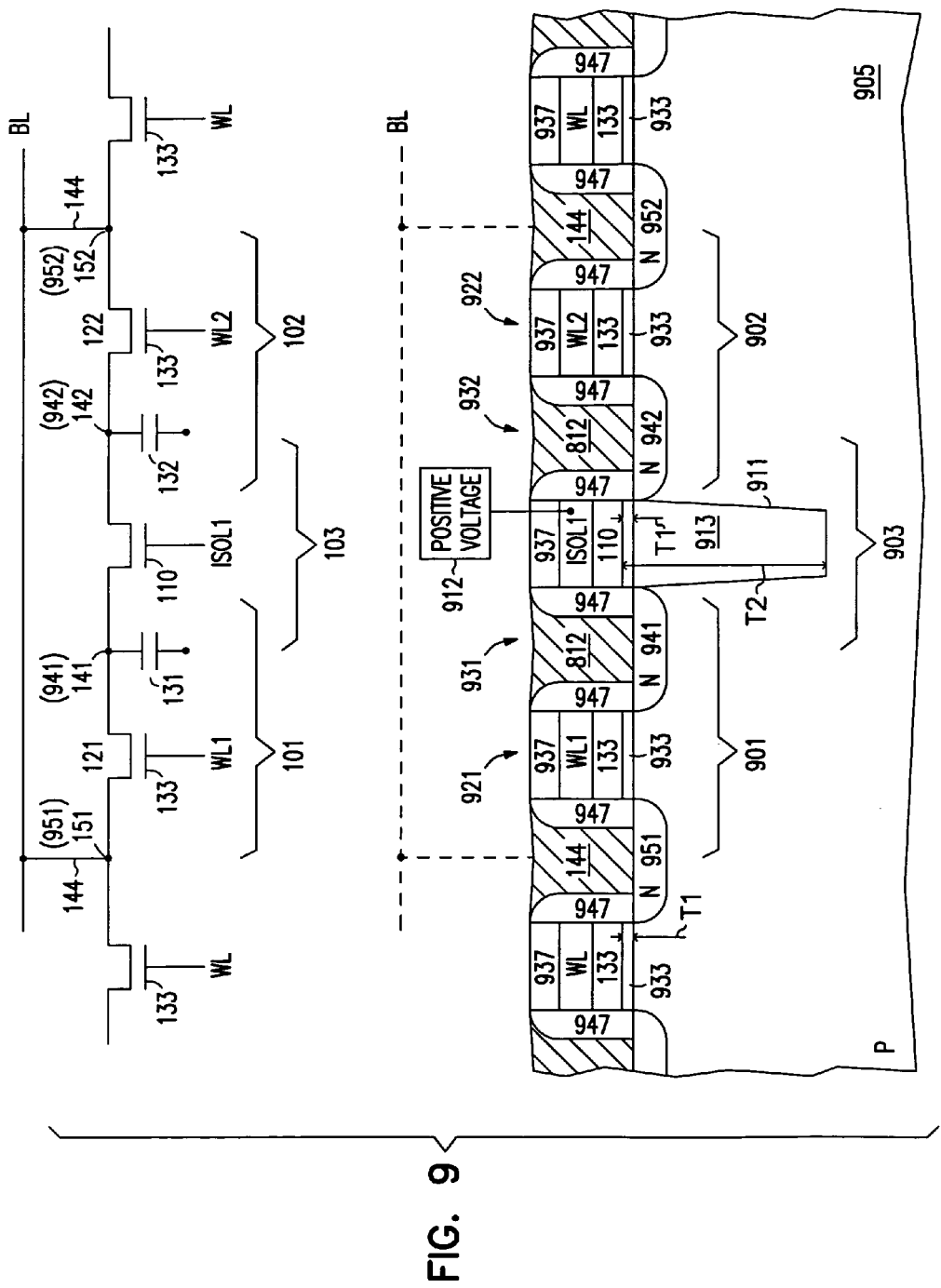
FIG. 9 is a cross-section of structures of a number of memory cells and an isolation device according to an embodiment of the invention.

Sectional line 9—9 is a portion of the circuit layout that is shown in sectional view in FIG. 9.

FIG. 9 is a cross-section of structures of a number of memory cells and an isolation device according to an embodiment of the invention. For ease of understanding, FIG. 9 also includes a corresponding schematic diagram of a portion of memory array 100 of FIG. 1. For simplicity, both the schematic diagram and the structural diagram have the same reference numbers for similar elements. FIG. 9 shows structures of memory cells 901 and 902, and isolation device 903, word lines WL1 and WL2, and one of the bit lines BL. Other memory cells and isolation devices have similar structures as that shown in FIG. 9.

Structures shown in FIG. 9 are formed on top of a semiconductive substrate 905, such as monocrystalline silicon. In the context of this description, the term "semiconductive substrate" refers to any construction having semiconductive material, including, but not limited to, bulk semiconductive materials such as a semiconductive wafer (either alone or in assemblies including other materials thereon), and semiconductive material layers (either alone or in assemblies including other materials). The term "substrate" refers to any supporting structure, including, but not limited to, the semiconductive substrates described above.

Memory cells 901 and 902, and isolation device 903 correspond to memory cells 101 and 102, and isolation device 103 (FIG. 1).

Memory cell 901 includes diffusion regions 951 and 941 formed on substrate 905, and gate 133 formed above the substrate and separated from the substrate by a gate dielectric 933 with a gate dielectric thickness T1. Diffusion regions 951 and 941, and gate 133 and gate dielectric 933 below WL1 form an access transistor 921 corresponding to access transistor 121 (FIG. 1).

Bit line contact 144 of memory cell 901 is formed on diffusion region 951 and is insulated from laterally adjacent structures by a conventional dielectric sidewall 947. Bit line contact 144 of memory cell 901 connects to bit line BL formed atop via a connection shown as a dashed line for clarity.

Word line WL1 is formed on access gate 133 of transistor 921 and is insulated from structures formed atop by a conventional dielectric capping layer 937.

Memory cell 901 further includes a capacitor 931 sharing diffusion region 941 with transistor 921. Diffusion region 941 corresponds to one plate of capacitor 931. The other plate (cell plate) of capacitor 931 is omitted for clarity and is formed above a storage node contact 812. Storage node contact 812 is insulated from laterally adjacent structures by dielectric sidewalls 947. In some embodiments, storage node contact 812 is formed from conventional polysilicon. Capacitor 931 corresponds to capacitor 131 (FIG. 1).

Memory cell 902 includes diffusion regions 942 and 952 formed on substrate 905, and gate 133 formed above the substrate and separated from the substrate by gate dielectric 933 with a gate dielectric thickness T1. Diffusion regions 942 and 952, and gate 133 and gate dielectric 933 below WL2 form an access transistor 922 corresponding to access transistor 122 (FIG. 1). For simplicity, the gate dielectrics of all access transistors have the same reference number (933).

Bit line contact 144 of memory cell 902 is formed on diffusion region 952 and is insulated from laterally adjacent structures by dielectric sidewall 947. Bit line contact 144 of memory cell 902 connects to bit line BL formed atop via a connection shown as a dashed line for clarity.

Word line WL2 is formed on access gate 133 of transistor 922 and is insulated from structures formed atop by a conventional dielectric capping layer 937.

Memory cell 902 further includes a capacitor 932 sharing diffusion region 942 with transistor 922. Diffusion region 942 corresponds to one plate of capacitor 932. The other plate (cell plate) of capacitor 932 is omitted for clarity and is formed above storage node contact 812, which is insulated from laterally adjacent structures by dielectric sidewalls 947. Capacitor 932 corresponds to capacitor 132 (FIG. 1).

In FIG. 9, for clarity and for a better match between the schematic diagram and the structural diagram, the word line (WL) is viewed as an element separated from other elements such as the gate, dielectric layer under the gate, the dielectric capping layer above the gate, and the dielectric sidewall. However, in some embodiments, the word line is a combination of all of these elements. For example, word line WL1 is a combination of elements WL1, access gate 133, and the sounding dielectrics 933, 937, and 947. Similarly, the isolation line ISO1 (and other isolation lines) can also be a combination of elements ISOL1, isolation gate 110, and their surrounding dielectrics.

Isolation device 903 has a first electrode corresponding to diffusion region 941 and a second electrode corresponding to diffusion 942. Isolation gate 110 of isolation device 903 is formed between storage node contacts 812 and is insulated from these storage node contacts by dielectric sidewalls 947. Isolation gate 110 is separated from substrate 905 by an isolation dielectric 913 having an isolation dielectric thickness T2 greater than the gate dielectric thickness T1. As shown in FIG. 9, isolation dielectric 913 has at least a portion of the isolation dielectric formed within substrate 905. In some embodiments, T1 has a range of about 30 Angstroms to about 60 Angstroms.

Isolation dielectric 913 has a trench 911 formed in the substrate (below the surface of the substrate) and is filled with dielectric material. Trench 911 can be formed by a shallow trench insolation (ST1) method. Thus, in embodiments represented by FIG. 9, isolation dielectric 913 has an ST1 structure.

In some embodiments, isolation dielectric 913 includes only the dielectric portion indicated by T1. Thus, in these embodiments, isolation dielectric 913 of isolation device 903 and gate dielectrics 933 of transistors 921 and 922 have equal dielectric thickness (or T2 equals T1).

Isolation line ISOL1 is formed on isolation gate 110 and is insulated from structures formed atop by dielectric capping layer 937. Isolation line ISOL1 can be formed from conventional polysilicon.

Isolation device 903 is configured to provide electrical isolation between memory cells 101 and 102. Isolation dielectric thickness T2 is chosen such that when positive voltage 912 (such as V1) is applied to isolation gate 110, isolation device 903 does not turn on (or still in the off state). In some embodiments, T2 is about 4000 Angstroms. In other embodiments, T2 is ranging from about 3000 Angstroms to about 5000 Angstroms.

In embodiments represented by FIG. 9, substrate 905 includes silicon doped with a dopant, for example boron, to make it a P-type material. Diffusion regions 941, 942, 951, and 952 include silicon doped with a dopant, for example phosphorous, to make them an N-type material. In some embodiments, substrate 905 can be an N-type material and diffusion regions 941, 942, 951, and 952 can be P-type material.

The N-type material has excess electrons as majority carriers for conducting current. The P-type material has excess holes as majority carriers for conducting current. In the description, the term "diffusion region" refers to a region having a semiconductor material doped with a dopant to become either an N-type material or a P-type material.

When a data bit is stored in one of the memory cells 901 and 902 as a charge in the storage node (diffusion region 941 or 942) of capacitor 931 or 932, an electrical field is induced in isolation dielectric 913 (especially at edges of isolation dielectric 913) by diffusion regions 941 and 942. This electric field tends to cause gate-induced leakage current, in which the charge from the storage node of the capacitor (for example diffusion region 941) leaks to the substrate. Over time, this reduces the amount of the charge stored in memory cells 901. The gate-induced leakage current is largest when the storage node contact 812 is set to Vcc.

One way to reduce the gate-induced leakage current is to deplete majority carriers from the substrate region between diffusion regions 941 and 951. In FIG. 9, holes are the majority carriers of substrate region between diffusion regions 941 and 951. In some embodiments, increasing the voltage at isolation gate 110 by connecting it to a positive voltage depletes the majority carriers in the substrate region between diffusion regions 941 and 942. When the substrate region between diffusion regions 941 and 942 is depleted, the current leakage from diffusion regions 941 and 942 to the substrate is reduced.

Selecting the thickness T2 of isolation dielectric 913 to be greater than T1 of gate dielectric 933 increases a threshold voltage Vt associated with isolation device 103. As a result, gate-induced leakage current associated with isolation device 903 is reduced, providing increased storage times, allowing increased storage time between refresh cycles, reducing power dissipation and improving performance of memory array 100.

Figure 10:
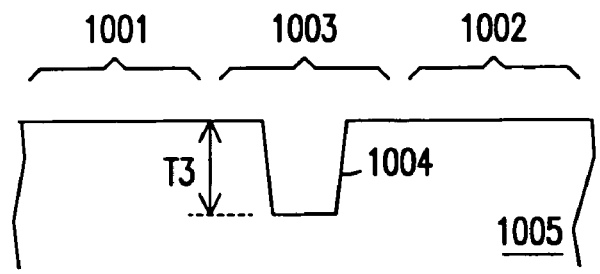
FIGS. 10–13 show various processing stages during the construction of the structures of FIG. 9 according to an embodiment of the invention.

FIGS. 10–13 show various processing stages during the construction of the structures of FIG. 9 according to another embodiment of the invention. In FIG. 10, substrate 1005 has memory cell regions 1001 and 1002 and isolation region 1003. These regions correspond to the regions of memory cells 901 and 902 and isolation device 903 (FIG. 9). A trench 1004 with a thickness (depth) T3 is formed in substrate 1005 at isolation region 1003. Trench 1004 corresponds to trench 911 (FIG. 9) and T3 corresponds to the thickness of isolation dielectric 913 (FIG. 9). In some embodiments, trench 1004 (FIG. 10) has depth T3 of about 4000 Angstroms. In other embodiments, T3 is ranging from about 3000 Angstroms to about 5000 Angstroms. In other embodiments, T3 can have other thicknesses (or depths). In some embodiments, a field threshold adjustment implant is performed, for example, by implanting boron into trench 1004.

Figure 11:
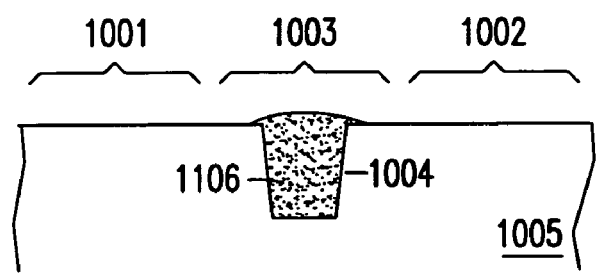
Figure 12:
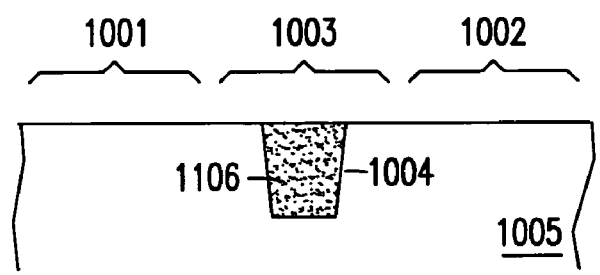
Figure 13:
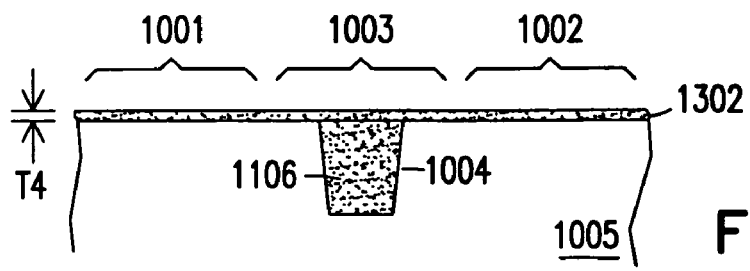

In FIG. 11, dielectric layer 1106 fills trench 1004. In some embodiments, the dielectric layer is silicon dioxide formed using a conventional TEOS process. In FIG. 12, dielectric layer 1106 is altered by planarization, for example, using conventional chemical-mechanical polishing. In FIG. 13, a dielectric layer 1302 with a thickness T4 is formed. In some embodiments, T4 has a range of about 30 Angstroms to about 60. In other embodiments, T4 can have other thicknesses. Thickness T4 corresponds to the thickness of gate dielectric 933 (FIG. 9). Following dielectric process, other subsequent processes are performed to complete structures shown in FIG. 9.

As previously mentioned, a threshold voltage of a transistor (device) is the voltage at which the transistor starts to conduct (turn on). In FIG. 9, when transistor 921 or 922 conducts, a current flows in a channel region between its source and drain (electrodes). For example, when transistor 921 conducts, a current flows between a channel region between diffusion regions 941 and 951.

Threshold voltage magnitude can be affected by channel implants. Specifically, during fabrication of semiconductor devices, a substrate can be implanted with certain type of dopants to modify or change the threshold voltage of a resultant device. Such channel implants can also affect a condition known as subsurface punchthrough, a phenomenon associated with a merging of the source and drain depletion regions. Specifically, as the channel gets shorter (as device dimensions get smaller), depletion region edges get closer together. When the channel length is decreased to roughly the sum of the two junction depletion widths, punchthrough is established. Punchthrough is undesired in transistors such as the access transistors 921 and 922 (FIG. 9).

One way of addressing punchthrough in submicron devices is through provision of a so-called halo implant, also known as a "pocket" implant. Halo implants are formed by implanting dopants (opposite in type to that of the source and drain) within the substrate proximate the source region, or the drain region, or both, and are typically disposed underneath the channel region. The implanted halo dopant raises the doping concentration only on the inside walls of the source-drain junctions, so that the channel length can be decreased without increasing the doping concentration of in the channel. That is, punchthrough does not set in until a shorter channel length, because of the halo implant.

Figure 14:
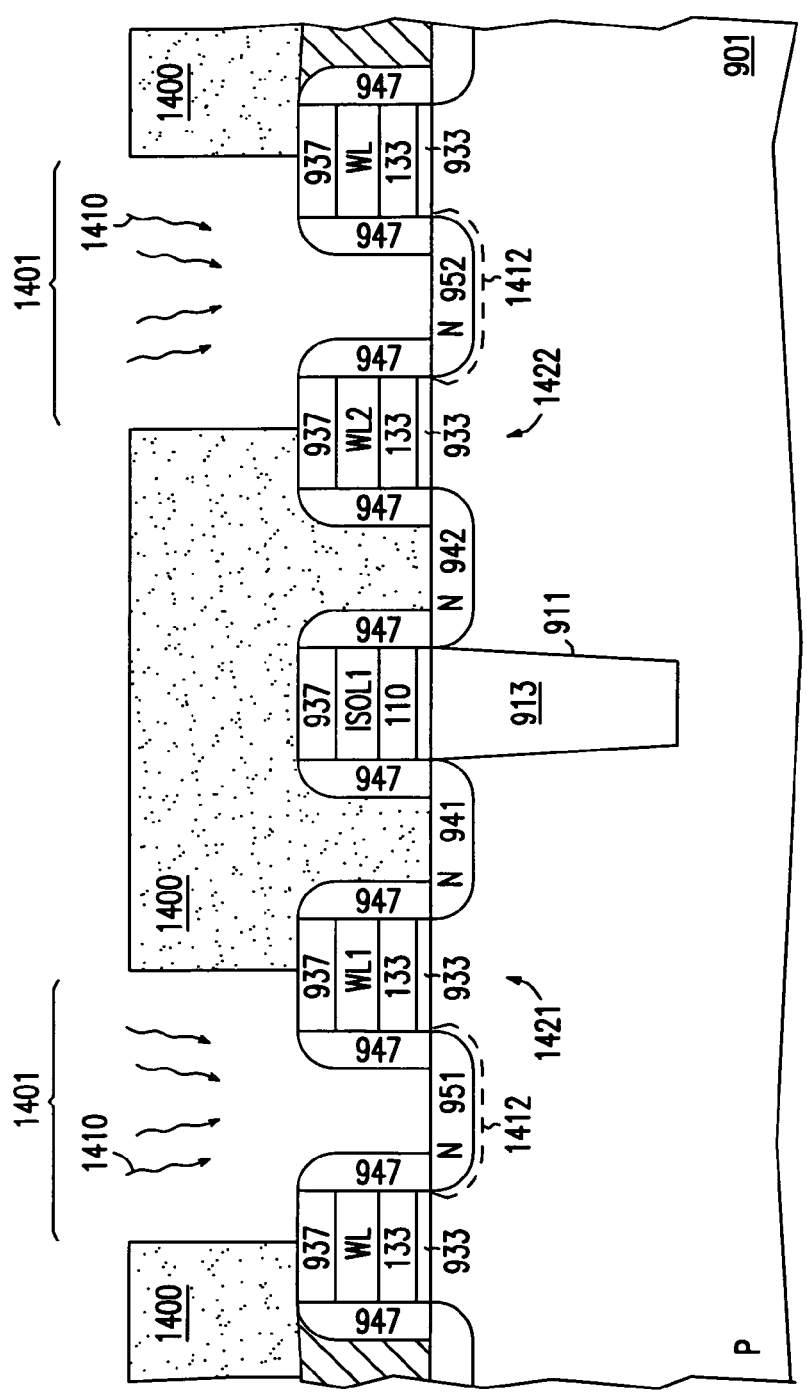
FIG. 14 is a simplified cross-section of the structures of FIG. 9 at a processing stage according an embodiment of the invention

FIG. 14 is a simplified cross-section of the structures of FIG. 9 at a processing stage according an embodiment of the invention. A masking material 1400 has been applied and patterned following formation and patterning of dielectrics 913 and 933, gates 133 and 110, word lines WL, and dielectric capping layer 937. Openings 1401 in the masking material 1400 correspond to locations where bit line contacts 144 (FIG. 9) will later be formed.

Areas 1421 and 1422 correspond to access transistors 921 and 922 (FIG. 9) at a later stage in processing. Each of these access transistors includes source and drain diffusion regions (electrodes) 941, 942, 951, and 952, with diffusion regions 951 and 952 being shared by adjacent access transistors.

The openings 1401 are formed above regions 951 and 952, upon which bit line contacts 144 will later be formed. By implanting only the bit line contact side regions of the access devices with a halo implant 1410, halo regions 1412 are formed on only those diffusion regions corresponding to access device electrodes that are later coupled to bit line contacts 144 (FIG. 9). This allows the channel doping to be reduced while maintaining the same threshold voltage and subthreshold voltage for the access devices. The lower channel doping, in turn, gives rise to improved memory refresh characteristics, because charge leakage from diffusion regions 941 or 942 is reduced. In some embodiments, halo implant 1410 includes boron.

It will be appreciated that when boron is implanted into a n-type device, n-well bias plugs and other conventional features are masked to protect the electrical properties of these features.

When the halo implant 1410 is performed prior to formation of sidewalls 947 (FIG. 9), it is normally accompanied by an n-minus implant resulting in diffusion regions 951 and 952. When the halo implant 1410 is performed after formation of the sidewalls 947, it is assumed that n-minus regions 951 and 952 were previously formed as part of a lightly-doped drain structure.

By combining the isolation device 903 having an increased threshold voltage together with access transistors 921 and 922 (FIG. 9) having halo implants only at the bit line contact, the threshold voltages for the isolation devices 903 and access transistors 921 and 922 can be independently adjusted. As a result, the inter-cell isolation characteristics of memory array 100 (FIG. 1) are improved, without compromise of access transistors 921 and 922 charge leakage characteristics.

Further, since isolation device 903 improves the isolation between adjacent memory cells, it allows a single-row redundancy scheme instead of the double-row redundancy method used in many memory devices. For example, in FIG. 1, when a defect occurs in CELL ROW1, a single redundant row can be used to replace CELL ROW1 without unacceptable performance degradation of CELL ROW2.

Figure 15:
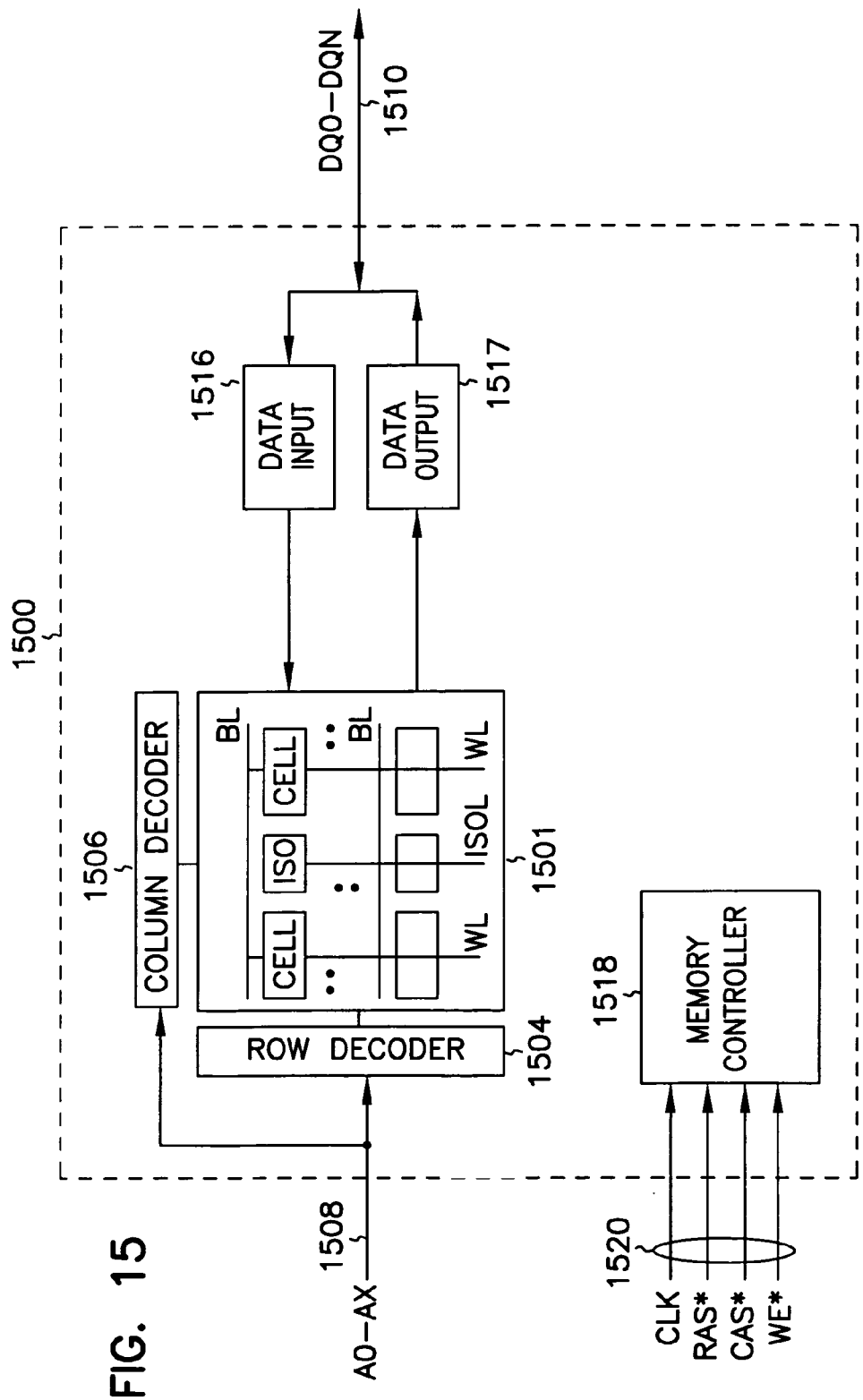
FIG. 15 shows a memory device according to an embodiment of the invention.

FIG. 15 shows a memory device according to an embodiment of the invention. Memory device 1500 includes a memory array 1501 having plurality of memory cells (CELL) isolation devices (ISO), all arranged in rows and columns along with word lines WL, isolation lines ISOL, and bit lines BL. Row and column decoders 1504 and 1506 provide access to the memory cells in response to address signals A0–AX on address lines (or address bus) 1508. A data input circuit 1516 and data output circuit 1517 transfer data between the memory cells and data lines (or data bus) 1510. Data lines 1510 carry data signals DQ0–DQN. A memory controller 1518 controls the operations of memory device 1500 based on control signals on control input lines 1520. Examples of control signals include a clock signal CLK, a row access strobe signal RAS*, a column access strobe CAS* signal, and a write enable signal WE*. Memory device 1500 is an integrated circuit and includes other circuit elements. For simplicity, the other circuit element are omitted from FIG. 15.

Memory array 1501 corresponds to memory array 100 (FIG. 1). Memory cells (CELL) and isolation devices (ISO) correspond memory cells 101 and 102, and isolation device 103 (FIG. 1), or memory cells 901 and 902, and isolation device 903 (FIG. 9).

Figure 16:
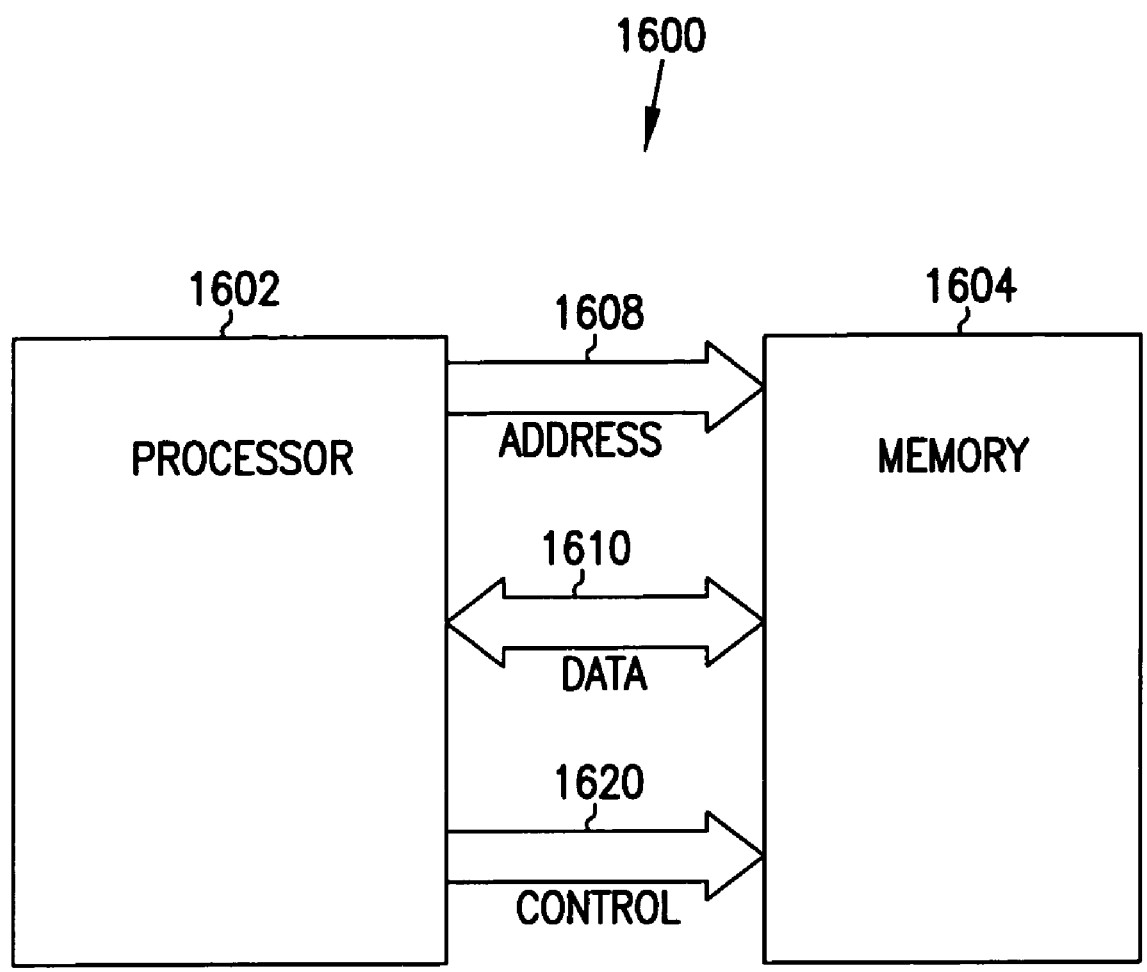
FIG. 16 shows a system according to an embodiment of the invention.

FIG. 16 shows a system according to an embodiment of the invention. System 1600 includes a first integrated circuit (IC) 1602 and a second IC 1604. ICs 1602 and 1604 can include processors, controllers, memory devices, application specific integrated circuits, and other types of integrated circuits. In embodiments represented by FIG. 16, for example, IC 1602 represents a processor, and IC 1602 represents a memory device. Processor 1602 and memory device 1604 communicate using address signals on lines 1608, data signals on lines 1610, and control signals on lines 1620.

Memory device 1604 can be memory device 1500 of FIG. 15. Thus, memory device 1604 has a memory array such as memory array 1501 with memory cells isolation devices corresponding to memory cells 101 and 102, and isolation device 103 (FIG. 1) or memory cells 901 and 902, and isolation device 903 (FIG. 9).

System 1600 represented by FIG. 16 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provides structures and methods for improving isolation between adjacent memory cells to reduce the charge leakage to improve the refresh operation, increase the time availability of the data, and offer alternative ways for replacing defected memory cells. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A method comprising:
  accessing data in a first storage node of a memory cell of a memory device; and
  applying a positive voltage to a gate of an isolation device, the isolation device being located between the first storage node and a second storage node of the memory device for isolating the first storage node from the second storage node.

2. The method of claim 1, wherein the isolation device includes a first electrode sharing a diffusion region with the first storage node, a second electrode sharing a diffusion region with the second storage node, and a shallow trench isolation structure between the first and second electrodes.

3. The method of claim 1, wherein the isolation device has a threshold voltage, and wherein the threshold voltage is greater than the positive voltage.

4. The method of claim 1, wherein the isolation device has a threshold voltage, and wherein the threshold voltage is at least three times greater than the positive voltage.

5. The method of claim 1, wherein the positive voltage is at least equal to a supply voltage of the memory device.

6. The method of claim 1 further comprising:
  controlling a resistance of a resistive device, the resistive device being located between the gate of the isolation device and a power node.

7. The method of claim 6, wherein the resistive device includes a transistor, and wherein controlling the resistance includes applying a bias voltage to a gate of the transistor.

8. A method comprising:
  accessing data in a first storage node of a memory cell of a memory device;
  applying a non-ground potential to a gate of an isolation device, the isolation device being located between the first storage node and a second storage node of the memory device for preventing conductivity between the first and second storage nodes, the isolation device being in an inactive state during the applying of the non-ground potential; and
  controlling a current on a path between the gate of the isolation device and a power node.

9. The method of claim 8, wherein controlling the current includes choosing a resistance of the path.

10. The method of claim 9, wherein choosing the resistance includes applying a bias voltage to a gate of a transistor, the transistor being coupled between the gate of the isolation device and the power node.

11. The method of claim 8, wherein applying the non-ground potential includes applying a negative voltage to the gate of the isolation device.

12. The method of claim 8, wherein the applying the non-ground potential includes applying a positive voltage to the gate of the isolation device.

13. The method of claim 12, wherein the positive voltage is greater than a supply voltage of the memory device.

14. The method of claim 12, wherein a threshold voltage of the isolation device is at least three times greater than the positive voltage applied to the gate of the isolation device.

15. The method of claim 8, wherein accessing the data includes activating an access transistor coupled to the first storage node, and wherein the isolation device has a threshold voltage greater than a threshold voltage of the access transistor.

16. The method of claim 15, wherein activating the access transistor includes applying a gate voltage to a gate of the access transistor, and wherein the threshold voltage of the isolation device is at least three time greater than the gate voltage.

17. A method comprising:
activating a first access transistor to access data in a first storage node of a first memory cell of a memory device;
activating a second access transistor to access data in a second storage node of a second memory cell of the memory device; and
applying a positive voltage to a gate of an isolation device, the isolation device being located between the first and second storage nodes, and the isolation device being in an inactive state during the applying of the positive voltage.

18. The method of claim 17, wherein activating the first access transistor includes applying a gate voltage to a gate of the first access transistor, and wherein the positive voltage is at least equal to the gate voltage.

19. The method of claim 17, wherein the isolation device has a threshold voltage greater than a threshold voltage of each of the first and second access transistors.

20. The method of claim 17, wherein the isolation device has a threshold voltage greater than a supply voltage of the memory device.

21. The method of claim 17, wherein the positive voltage is at least equal to a supply voltage of the memory device.

22. The method of claim 17 further comprising:
selecting a resistance of a resistive device coupled between the gate of the isolation device and a power node.

23. A method comprising:
activating a first access transistor to access data in a first storage node of a first memory cell of a memory device;
activating a second access transistor to access data in a second storage node of a second memory cell of the memory device;
applying a non-ground voltage to a gate of an isolation device, the isolation device being located between the first and second storage nodes; and
modifying a resistance of a path between a power node and the gate of the isolation device.

24. The method of claim 23, wherein the applying the non-ground potential includes applying a positive voltage to the gate of the isolation device.

25. The method of claim 24, wherein the positive voltage is at least equal to a supply voltage of the memory device.

26. The method of claim 23, wherein modifying the resistance includes selecting a resistance of a resistor, the resistor being located between the gate of the isolation device and the power node.

27. The method of claim 23, wherein modifying the resistance includes applying a bias voltage to a gate of a transistor, the transistor being coupled between the gate of the isolation device and the power node.

28. The method of claim 23, wherein modifying the resistance includes applying a bias voltage to a gate of at least one transistor of a plurality of transistors, the plurality of transistors being coupled in parallel between the gate of the isolation device and the power node.

29. The method of claim 23, wherein modifying the resistance includes increasing a resistance of a path between the gate of the isolation device and the power node for limiting a current flowing on the path when a defect occurs.

30. The method of claim 23, wherein modifying the resistance includes applying a bias voltage to a gate of a transistor, the transistor being located on a path between the gate of the isolation device and the power node for allowing a current to flow on the path when a defect occurs.

31. The method of claim 23, wherein modifying the resistance includes applying a bias voltage to a gate of at least one transistor of a plurality of transistors, the plurality of transistors being coupled in parallel on a path between the gate of the isolation device and the power node for allowing a current to flow on the path when a defect occurs.

32. A method comprising:
transferring data between a processor and at least one storage node of a memory cell of a memory device; and
applying a positive voltage to a gate of an isolation device, the isolation device being located between the first storage node and a second storage node of the memory device for isolating the first storage node from the second storage node.

33. The method of claim 32, wherein the isolation device includes a first electrode sharing a diffusion region with the first storage node, a second electrode sharing a diffusion region with the second storage node, and a shallow trench isolation structure between the first and second electrodes.

34. The method of claim 32, wherein the isolation device has a threshold voltage, and wherein the threshold voltage is greater than the positive voltage.

35. The method of claim 32, wherein the positive voltage is at least equal to a supply voltage of the memory device.

36. The method of claim 32 further comprising:
controlling a resistance of a resistive device, the resistive device being located between the gate of the isolation device and a power node.

* * * * *